(12) United States Patent
Tel et al.

(10) Patent No.: US 8,937,705 B2
(45) Date of Patent: Jan. 20, 2015

(54) LITHOGRAPHIC APPARATUS AND DEVICE MANUFACTURING METHOD WITH RADIATION BEAM INSPECTION USING MOVEABLE REFLECTING DEVICE

(75) Inventors: Wim Tjibbo Tel, Helmond (NL); Hans Van Der Laan, Veldhoven (NL); Cassandra May Owen, Chandler, AZ (US); Todd J. Davis, Gilbert, AZ (US); Todd David Hiar, Gilbert, AZ (US); Theodore Allen Paxton, Chandler, AZ (US)

(73) Assignee: ASML Netherlands B.V., Veldhoven (NL)

( * ) Notice: Subject to any disclaimer, the term of this patent is extended or adjusted under 35 U.S.C. 154(b) by 954 days.

(21) Appl. No.: 12/437,009

(22) Filed: May 7, 2009

(65) Prior Publication Data

US 2009/0219500 A1    Sep. 3, 2009

Related U.S. Application Data

(62) Division of application No. 11/215,123, filed on Aug. 31, 2005, now abandoned.

(51) Int. Cl.
*G03B 27/68* (2006.01)
*G03F 7/20* (2006.01)

(52) U.S. Cl.
CPC ........ *G03F 7/70375* (2013.01); *G03F 7/70666* (2013.01)
USPC .......................................................... 355/52

(58) Field of Classification Search
CPC .................................................. G03F 7/70666
USPC .......................................... 355/52, 67, 69, 53
See application file for complete search history.

(56) References Cited

U.S. PATENT DOCUMENTS 5,229,872 A    7/1993  Mumola
5,296,891 A    3/1994  Vogt et al.
(Continued)

FOREIGN PATENT DOCUMENTS

EP    0 900 412 B1    3/1999
EP    1 041 443 A2    10/2000
(Continued)

OTHER PUBLICATIONS

Notification of Reasons for Refusal mailed Mar. 16, 2010 for Japanese Patent Application No. 2006-232960, 8 pgs.
(Continued)

*Primary Examiner* — Chia-how Michael Liu
(74) *Attorney, Agent, or Firm* — Sterne, Kessler, Goldstein & Fox P.L.L.C.

(57) ABSTRACT

A lithographic apparatus can include the following devices: a patterning system, a projection system, and a radiation beam inspection device. The patterning system can be configured to provide a patterned radiation beam. The projection system can be configured to project the patterned radiation beam onto a target portion of a substrate. Further, the radiation beam inspection device can be configured to inspect at least a part of the patterned radiation beam. In a substrate exposure position, the projection system is configured to expose a pattern of radiation on the substrate using the patterned radiation beam and the radiation beam device is configured to move the reflecting device away from a light path of the patterned radiation beam. In a radiation beam inspection position, the radiation beam inspection device is configured to move the reflecting device into the light path of the patterned radiation beam.

26 Claims, 9 Drawing Sheets

(56) References Cited

U.S. PATENT DOCUMENTS

| | | |
|---|---|---|
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,114,071 A | 9/2000 | Chen et al. |
| 6,133,986 A | 10/2000 | Johnson |
| 6,177,980 B1 | 1/2001 | Johnson |
| 6,379,868 B1 | 4/2002 | White |
| 6,486,939 B2 | 11/2002 | Lin |
| 6,515,272 B1 | 2/2003 | Fontaine et al. |
| 6,519,760 B2 | 2/2003 | Shi et al. |
| 6,687,041 B1 | 2/2004 | Sandstrom |
| 6,741,334 B2 | 5/2004 | Asano et al. |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2002/0087943 A1 | 7/2002 | Asano et al. |
| 2003/0061958 A1 | 4/2003 | Zhang |
| 2003/0081303 A1 | 5/2003 | Sandstrom et al. |
| 2003/0082463 A1 | 5/2003 | Laidig et al. |
| 2003/0099026 A1 | 5/2003 | Sandstrom |
| 2004/0041104 A1 | 3/2004 | Liebregts et al. |
| 2004/0047023 A1 | 3/2004 | Sandstrom |
| 2004/0130561 A1 | 7/2004 | Jain |
| 2004/0142251 A1 | 7/2004 | Hsu et al. |
| 2004/0265707 A1 | 12/2004 | Socha |
| 2005/0007572 A1 | 1/2005 | George et al. |
| 2005/0028129 A1 | 2/2005 | Hsu et al. |
| 2005/0053848 A1 | 3/2005 | Wampler et al. |
| 2005/0219502 A1 | 10/2005 | Sandstrom et al. |
| 2006/0146309 A1 | 7/2006 | Hult |
| 2007/0046917 A1 | 3/2007 | Tel et al. |

FOREIGN PATENT DOCUMENTS

| | | |
|---|---|---|
| EP | 1 439 419 A2 | 7/2004 |
| EP | 1 439 420 A1 | 7/2004 |
| JP | 63-033818 A | 2/1988 |
| JP | 7-111235 A | 4/1995 |
| JP | 8-008161 A | 1/1996 |
| JP | 11-016808 A | 1/1999 |
| JP | 2000-203768 A | 7/2000 |
| JP | 2001-068399 A | 3/2001 |
| JP | 2001-135562 A | 5/2001 |
| JP | 2002-203768 A | 7/2002 |
| JP | 2002-367900 A | 12/2002 |
| JP | 2004-063983 A | 2/2004 |
| KR | 2000-0010868 A | 2/2000 |
| KR | 2001-0006940 A | 1/2001 |
| WO | WO 98/33096 A1 | 7/1998 |
| WO | WO 98/38597 A2 | 9/1998 |
| WO | WO 98/38597 A3 | 9/1998 |
| WO | WO 98/40791 A1 | 9/1998 |
| WO | WO 99/45441 A1 | 9/1999 |
| WO | WO 2005/106594 A2 | 11/2005 |

OTHER PUBLICATIONS

English Abstract of Japanese Publication No. 2002-506236T published Feb. 26, 2002, 1 pg.

Commentary of Notification of Reasons for Refusal mailed Jun. 16, 2009 for Japanese Patent Application No. 2006-232960, 4 pgs.

D. Flagello and B. Geh, "Lithographic Lens Testing: Analysis of Measured Aerial Images, Interferometric Data and Photoresist Measurements", SPIE 2726, 788-798 (1996).

Search Report, dated Dec. 4, 2006, for European Patent Application No. EP 06 25 4320, 7 pages.

Office Action for Korean Patent Application No. 10-2006-0083781 mailed on Jul. 27, 2007, 3 pages.

Notification of Reasons for Refusal mailed Jun. 16, 2009 for Japanese Patent Application No. 2006-232960, 4 pgs.

Non-Final Rejection mailed Apr. 25, 2008 for U.S. Appl. No. 11/215,123, 14 pgs.

Final Rejection mailed Sep. 17, 2008 for U.S. Appl. No. 11/215,123, 13 pgs.

Second Non-Final Rejection mailed Jan. 13, 2009 for U.S. Appl. No. 11/215,123, 11 pgs.

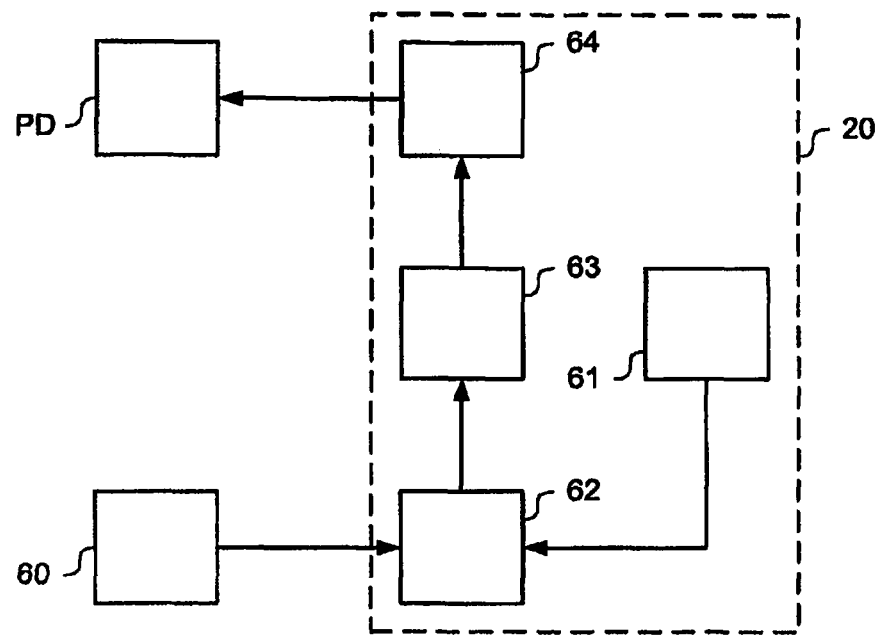
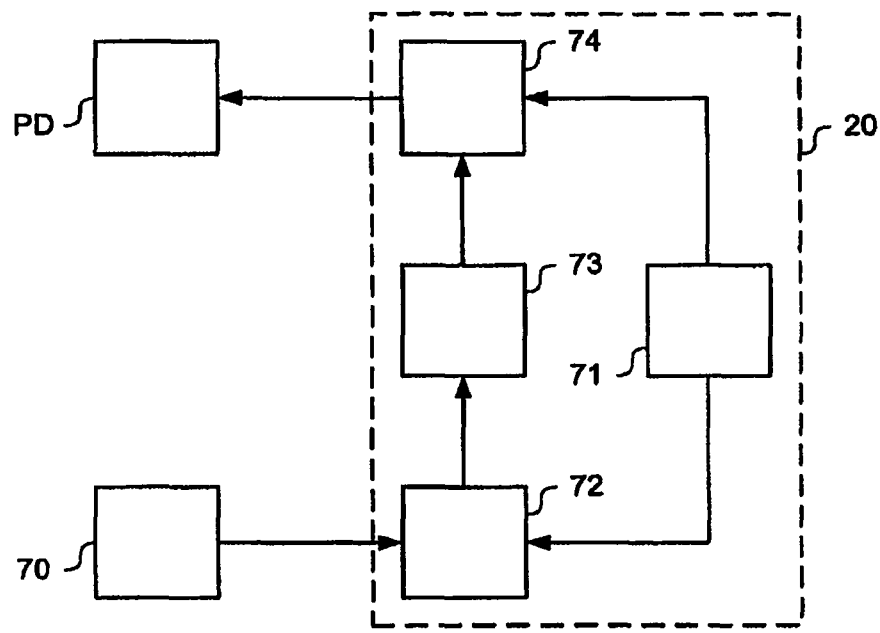

LITHOGRAPHIC APPARATUS AND DEVICE MANUFACTURING METHOD WITH RADIATION BEAM INSPECTION USING MOVEABLE REFLECTING DEVICE

CROSS REFERENCE TO RELATED APPLICATION

This application is a divisional application of U.S. patent application Ser. No. 11/215,123, filed Aug. 31, 2005, entitled "Lithographic Apparatus and Device Manufacturing Method with Radiation Beam Inspection," which is incorporated herein by reference in its entirety.

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

At present, lithographic processes are used in particular to form devices, such as integrated circuit devices, that have very small patterned features. There is a continuing demand to reduce the size of the pattern features. The limit on the size of the pattern features that can be formed for a given process is partially determined by the wavelength of the radiation that is used. For a given wavelength and lithographic apparatus, it is not possible to form patterned features below a given size. However, due to the demand to form devices with patterned features as small as possible, it is usual to operate a lithographic system as close to the limit as possible. When operating a lithographic process close to the resolution limit, diffraction effects may cause spurious artifacts to appear in the pattern of radiation projected onto a substrate, e.g., spurious features which appear on the pattern of radiation exposed on the substrate, but which were not part of the pattern that was desired to be formed on the substrate.

Conventional devices have simulated the spurious effects and to modify the pattern set by the patterning device such that, once the spurious effects are taken into account, the actual pattern of radiation exposed on the substrate is as close as possible to the actual pattern desired. In addition to altering the pattern provided by the patterning device, other operational settings of the lithographic apparatus have an affect on the generation of spurious pattern features. Other conventional devices have taken such settings into account when attempting to model the spurious effects in order to predict the optimum design for the patterning device and the optimum operational settings of the lithographic apparatus in order to expose the required pattern of radiation on the substrate.

However, simulation techniques for predicting the spurious effects are not precise. Accordingly, it is typically necessary to use such a simulation technique to predict a pattern for the patterning device, expose a substrate using the predicted pattern, process the substrate, inspect the resulting pattern formed on the substrate in order to determine how it differs from the desired pattern and then use this information to improve the simulation of the spurious effects in order to provide a revised pattern for the patterning device. This process may need to be repeated several times until a satisfactory pattern for the patterning device is provided. Such a procedure is time-consuming and expensive, especially if a reticle is used as the patterning device, because manufacturing reticles is expensive and a new reticle must be manufactured for each revision of the pattern for the patterning device.

Therefore, what is needed is a system and method for ensuring that a desired pattern of radiation is exposed on a substrate without requiring time-consuming and expensive procedures.

SUMMARY

In one embodiment of the present invention, there is provided a lithographic apparatus comprising an illumination system, a patterning device, a projection system, and a radiation inspection device. The illumination system conditions a radiation beam. The patterning device modulates the cross-section of the radiation beam. The projection system projects the modulated radiation beam onto a target portion of a substrate. The radiation beam inspection device inspects at least a part of the modulated radiation beam. The lithographic apparatus is operable in a substrate exposing configuration and a radiation beam inspecting configuration. In the substrate exposing configuration, the lithographic apparatus is configured such that the modulated beam of radiation exposes a pattern of radiation on a substrate. In the radiation beam inspecting configuration, the radiation beam inspection device inspects a pattern of radiation that would be formed on a substrate if the lithographic apparatus was in the substrate exposing configuration.

In a further embodiment of the present invention, there is provided a method of optimizing the operation of a lithographic apparatus for the formation of a device on a substrate using a lithographic apparatus comprising the following steps. Modulating a radiation beam using a patterning device. Projecting the modulated beam of radiation onto a radiation beam inspection device that inspects at least a part of the modulated radiation beam to determine the corresponding pattern that would be exposed on a substrate if the modulated beam of radiation were projected on the substrate. Determining at least one modification of the operation of the lithographic apparatus necessary to minimize the difference between a required pattern to be exposed on the substrate and the pattern determined by the radiation beam inspection device.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 11:
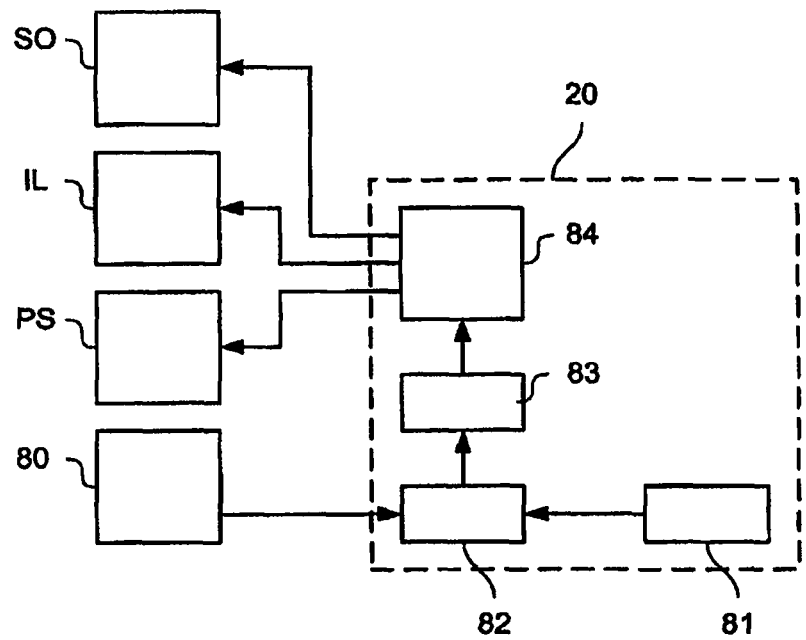

FIGS. 9, 10, and 11 depict various control systems for a lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
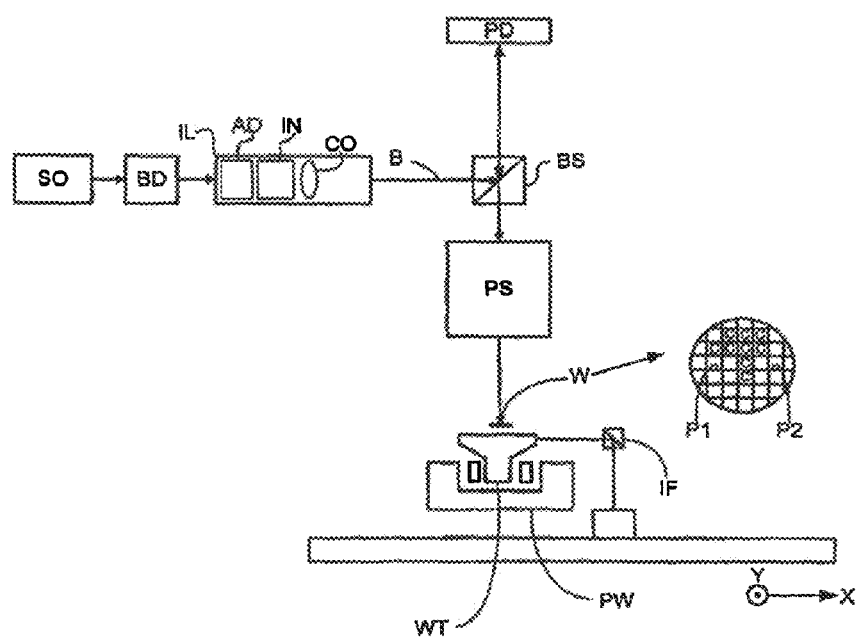
FIGS. 1 and 2 depict lithographic apparatus, according to various embodiments of the present invention.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
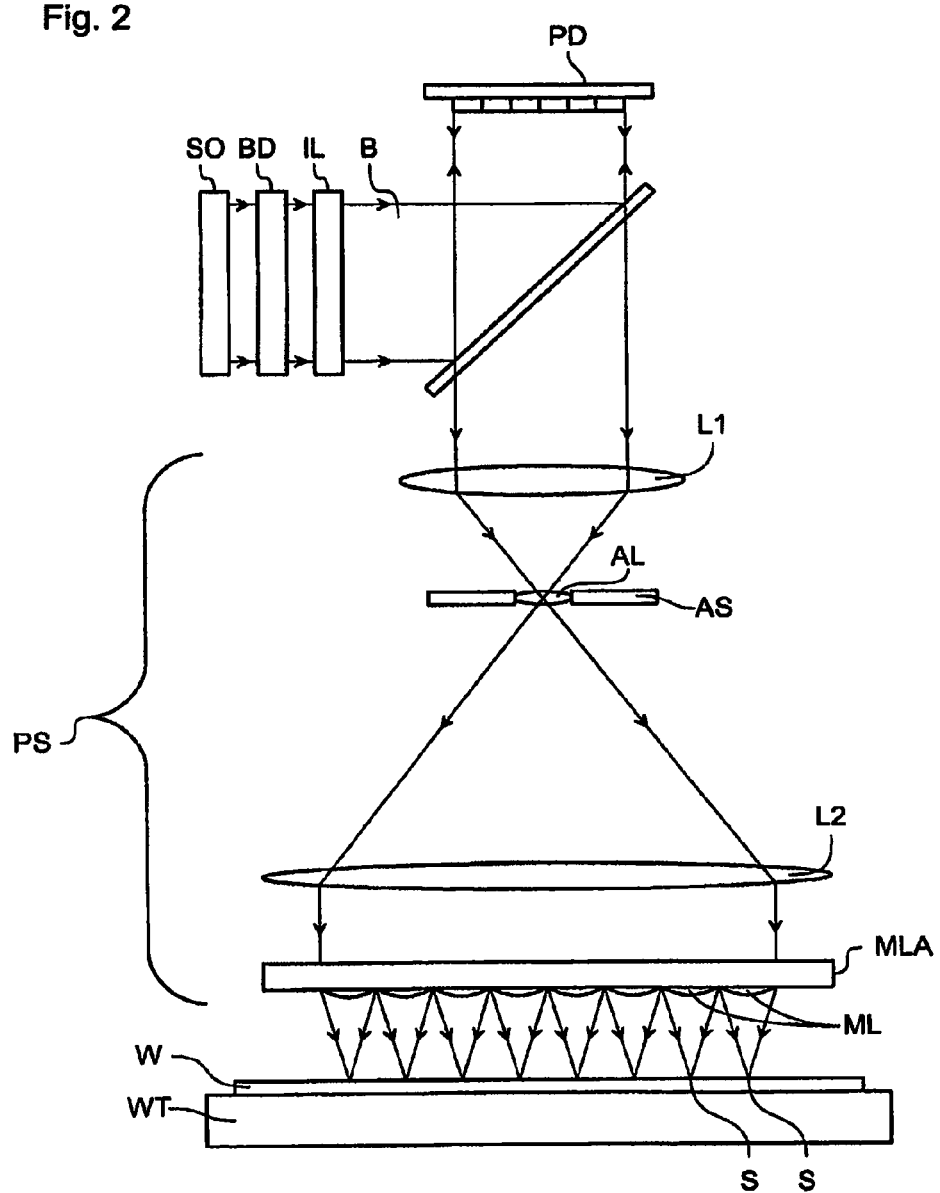

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 can not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
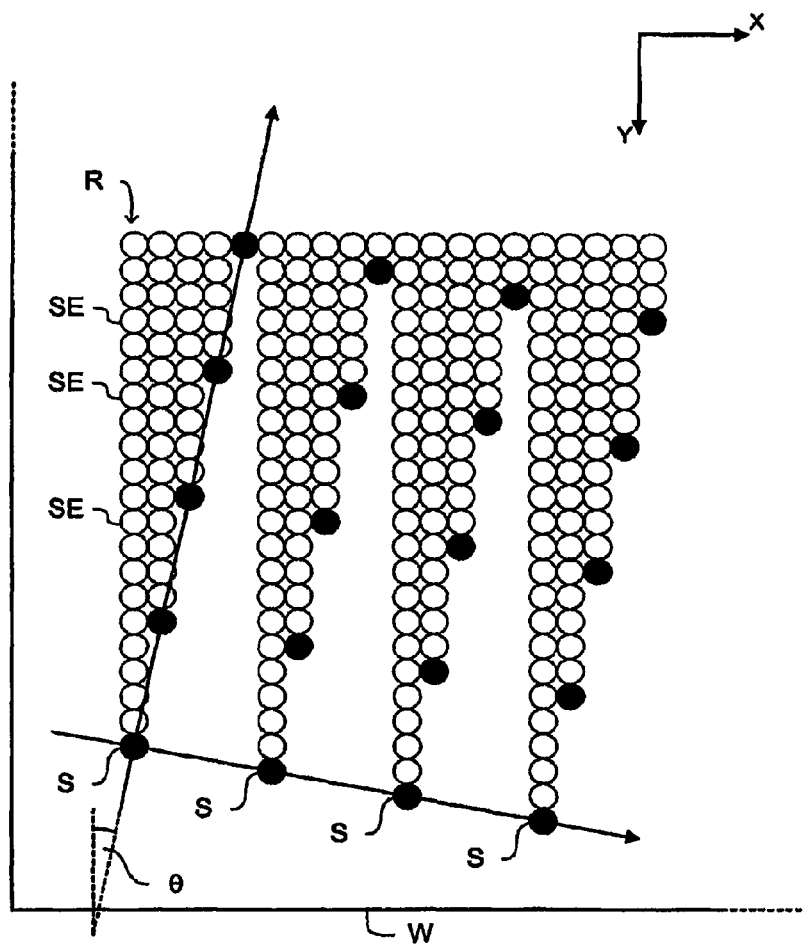
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
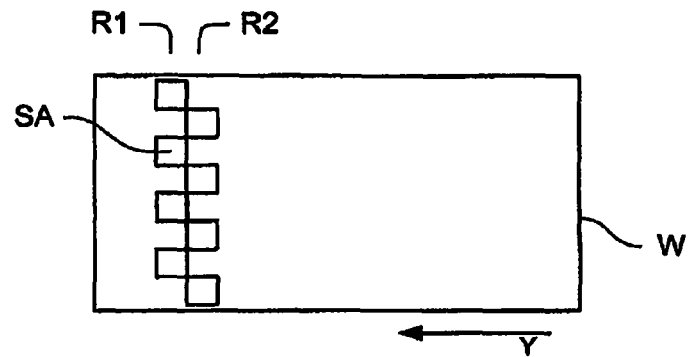
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Embodiment 1

Figure 5A:
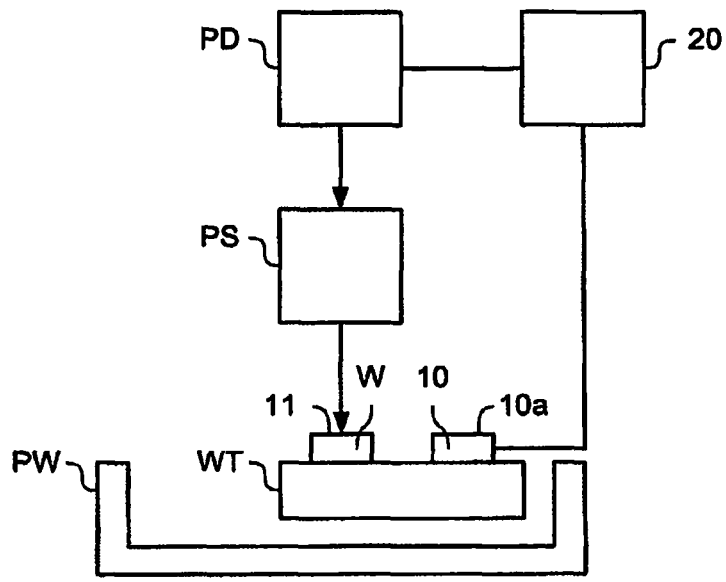
FIGS. 5A and 5B depict a lithographic apparatus of a first embodiment of the invention in a substrate exposing configuration and a radiation beam inspecting configuration, respectively, according to the present invention.
Figure 5B:
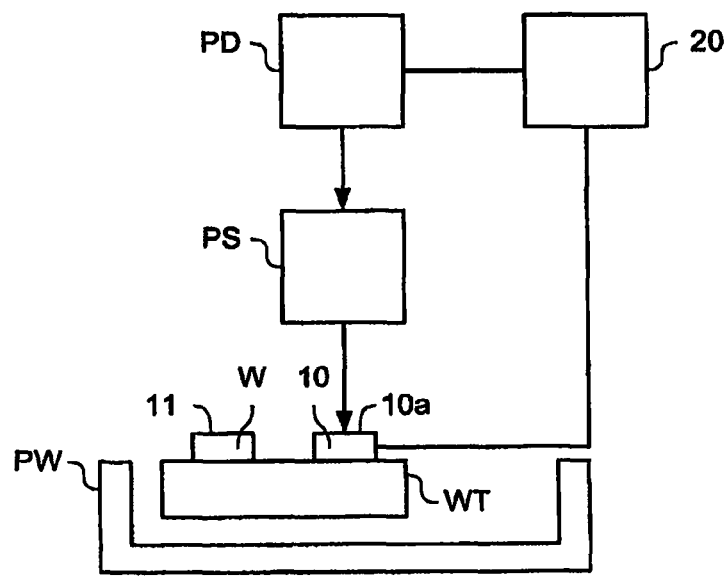

FIGS. 5A and 5B depict a lithographic apparatus of a first embodiment of the present invention. As shown in FIG. 5A, a substrate W is supported on the substrate table WT. When the apparatus is in a substrate exposing configuration as shown in FIG. 5A, a beam of radiation modulated by the patterning device PD may be projected onto the substrate W by the projection system PS. As described above, the lithographic apparatus may, for example, be provided with an actuator PW that moves the substrate table WT relative to the projection system PS. Accordingly, with the substrate W supported on the substrate table WT, the substrate W may be moved relative to the beam of radiation projected by the projection system PS such that the beam of radiation can be projected onto a desired part of the substrate W.

It will be appreciated that in order to move the substrate table relative to the substrate, the actuator PW may move the substrate table WT, keeping the projection system PS and other components required to generate the modulated beam of radiation stationary, or may move the projection system PS and other components necessary to produce the modulated beam of radiation and keep the substrate table WT stationary.

The lithographic apparatus according to the first embodiment of the invention may also be operated in a radiation beam inspecting configuration. FIG. 5B depicts a lithographic apparatus in this mode of operation. As shown, the substrate table WT has been moved relative to the projection system PS such that the modulated beam of radiation is projected by the projection system PS onto a radiation beam inspection device 10 which is also mounted on the substrate table WT.

The radiation beam inspection device 10 inspects at least a part of the modulated beam of radiation. The radiation beam inspection device 10 is configured to determine the pattern of radiation that would be exposed on the substrate if the lithographic apparatus was in the substrate exposing configuration. Accordingly, the radiation beam inspection device 10 is arranged such that, when the lithographic apparatus is in the radiation beam inspecting configuration, the surface of 10A of the radiation beam inspection device 10 on which the modulated beam of radiation is incident is in the same plane as would be the surface 11 of the substrate W if the lithographic apparatus were in the substrate exposing configuration.

The radiation beam inspection device 10 may comprise, for example, a camera, a CCD device, or any other sensor capable of imaging a pattern of radiation. In order to provide improved resolution, the radiation beam inspection device may include a lens or lens system to magnify the patterned beam of radiation prior to it being projected onto a sensor. Alternatively or additionally, the resolution of a sensor may be enhanced by forming a radiation blocking layer on the sensor, arranged with a plurality of very small apertures through the radiation blocking layer. The apertures may each be associated with one pixel or cell of the radiation sensor. Each aperture is smaller than the corresponding pixel or cell of the radiation sensor, and therefore only permits a portion of the radiation that, in the absence of the radiation blocking layer, would be incident on the pixel or cell to actually reach the pixel or cell of the radiation sensor. Accordingly the resolution of the sensor is enhanced to the size of the apertures. It will be appreciated, however, that such a sensor only inspects a portion of the beam of radiation projected onto the sensor at any given time. Suitable such devices are manufactured, for example, by Brion Technologies of Santa Clara, Calif.

As shown in FIGS. 5A and 5B, the radiation beam inspection device 10 sends data related to the pattern of radiation that would be projected onto a substrate if the apparatus was in the substrate exposing configuration to a control system 20. As described in greater detail below, the control system 20 compares the pattern detected by the radiation beam inspection device 10 with a pattern of radiation that is required to be exposed on the substrate W. The control system 20 determines the difference between the actual pattern of radiation being generated and the required pattern and, from this difference, determines changes to the operation of the lithographic apparatus in order to minimize the difference. Accordingly, the operation of the lithographic apparatus can be optimized for the exposure of a pattern of radiation on the substrate in the radiation beam inspection configuration. Subsequently, the lithographic apparatus can be switched to the substrate exposing configuration and the pattern of radiation exposed on the substrate W using the optimized operating conditions of the lithographic apparatus determined when the lithographic apparatus was in the radiation beam inspecting configuration. In this manner, it is possible to expose a pattern of radiation on the substrate W that closely matches the required pattern of radiation to be exposed on the substrate.

In an apparatus using an array of individually controllable elements as the patterning device, the modification of the operation of the lithographic apparatus in order to optimize the exposure of a pattern of radiation on the substrate W may, for example, include the modification of the pattern set on the array of individually controllable elements. The pattern may be altered, for example, by the addition of pattern features, by the removal of pattern features, and/or by the re-sizing of pattern features. In other words, changes to the pattern may be made in the same manner as is presently done for conventional lithography in order to reduce the appearance of spurious artifacts in the pattern exposed on the substrate. The control system 20 may therefore use a model of the known diffraction effects, for example, in order to predict the required modifications to the pattern set on the patterning device in order to generate a required exposure pattern of radiation on the substrate. However, in contrast to the conventional approach, in the present invention, when optimizing the pattern, there is no need to actually expose a modified pattern on a substrate, to process the substrate or subsequently inspect the pattern formed on the substrate. Instead, the pattern of radiation that would be exposed on the substrate is directly inspected by the radiation beam inspection device 10. Accordingly, a modified pattern to be set on the patterning device PD can be quickly checked to determine if it actually is an improvement, to determine how it has been improved and to determine if the pattern of radiation that would be exposed on the substrate is sufficiently close to the required pattern to be acceptable.

In some lithographic apparatus, the patterning device may be an array of individually controllable elements in which each individually controllable element can modulate the corresponding portion of the modulated beam of radiation to be one of three or more intensity levels. The number of possible intensity levels may, for example, but not limited to 256. In such an apparatus, the changes to the pattern set on the patterning device in order to optimize the pattern of radiation exposed on the substrate may include adjusting the intensity of the radiation in at least one part of the pattern set on the patterning device PD.

It will be appreciated that while the lithographic apparatus is in the radiation beam inspection configuration, multiple iterations of possible improvements to the pattern to be set on the patterning device PD can quickly be inspected. Accordingly, a highly optimized pattern can be determined with a minimal time-delay and far more cheaply than previously known optimization techniques. The optimization procedure within the control system 20 may, as discussed above, be based on a simulation of the expected spurious artifacts, checked and improved by an inspection of the actual pattern produced. In such a situation, the differences between the actual improvement of the pattern of radiation that would be exposed on a substrate, from setting a modified pattern on the patterning device PD, and the improvement predicted by the simulation may be used to improve the model that the simulations are based on, improving the optimization procedure for subsequent patterns. Additionally or alternatively, the optimization of the pattern set on the patterning device PD in order to generate a required pattern of exposure on the substrate W, may operate by making a series of random or pseudo-random modifications to the pattern set on the patterning device PD, inspecting the consequent patterns of radiation that would be exposed on the substrate W, selecting the modified pattern that results in an exposure pattern that is closest to the required pattern of exposure on the substrate and using this pattern as a basis for the next iteration. This procedure may be repeated until the pattern converges on an optimized design.

The radiation beam inspection device 10 may only inspect a portion of the modulated beam of radiation at one instant. Therefore, the radiation beam inspection device may be moved using the actuator PW for moving the substrate table WT such that the radiation beam inspection device 10 can inspect different portions of the modulated beam of radiation. Accordingly, the radiation beam inspection device 10 may, by means of successive movements, inspect the entirety of the modulated beam of radiation. This data may subsequently be used in order to optimize the entirety of the pattern set on the patterning device PD. It may not be necessary for the radiation beam inspection device 10 to inspect the entirety of the modulated beam of radiation. If, for example, the data from the radiation beam inspection device 10 is used in the control system to optimize a model used to simulate the creation of spurious artifacts within a pattern of radiation, it may only be necessary to inspect a portion of the modulated beam of radiation and the optimized model may then be used to determine the complete pattern to be set on the patterning device.

The lithographic apparatus in the radiation beam inspection configuration may be used to optimize the pattern, for example, a complete device to be formed on the substrate. This optimized design may then be used for production of the device both on lithographic apparatus that performed the design optimization (once the apparatus has been switched to the substrate exposing configuration) and on other lithographic apparatus (which may not have a radiation beam inspecting configuration). It will be appreciated that once the design has been optimized, the optimized design may be used to form a reticle (mask) for use with a conventional lithographic apparatus. Alternatively or additionally, at least a partial optimization procedure may be performed prior to the exposure of a pattern on a batch of substrates, a substrate or each device to be formed on a substrate. For example, a thorough optimization process may be performed once for a particular design and, subsequently, only a partial optimization procedure may be performed prior to the exposure of the pattern onto a batch of substrates, a single substrate or each device on a substrate.

The pattern of the radiation exposure required on a substrate may not directly correspond to the pattern of a device that is required to be formed on the substrate. For example, the pattern of radiation required to be exposed on a substrate may correspond to the pattern of the device required to be formed on the substrate (or a layer thereof), modified in order to take account of variations in conditions of processes other than the lithographic process. The other processes may include, for example, the application of the resist to the substrate and the development of the resist after the lithographic process. Variations in such other processes means that, although identical patterns of radiation may be exposed on two substrates or two parts of the same substrate, the pattern of the devices (or parts thereof) actually formed on the substrate(s) may vary slightly. These variations may be characterized. Such a characterization may be used to adjust the pattern of the radiation to be exposed on the substrate(s) such that the pattern of the devices (or parts thereof) actually formed on the substrate(s) are the same. Accordingly, although the nominal pattern to be formed on different parts of a substrate or different substrates within a batch may be the same, the actual pattern of the radiation exposure that is required may vary. Accordingly, as discussed above, it may be necessary to form at least a partial optimization of the pattern to be set on the patterning device PD prior to the exposure of a batch of substrates, a substrate or individual devices on a substrate, for example.

In addition to the modifications of the pattern set on the patterning device PD, the control system 20 may alternatively or additionally modify the operation of the lithographic apparatus to optimize the pattern of radiation exposed on a substrate by adjusting the intensity of the radiation beam provided by the illumination system, adjusting the conditioning of the radiation beam provided by the illumination system, such as adjusting the intensity distribution of the radiation in a pupil plane of the illuminator, and/or by adjusting one or more settings of the projection system. In the same manner as discussed above for pattern adjustments, the optimization of the settings may be performed using a simulation which is optimized and/or by performing random or pseudo-random variations in order to find the optimized settings.

It should be appreciated that the pattern set on the patterning device may be optimized as well as optimizing any or all of these settings. Likewise the optimization of the pattern set on the patterning device PD and any or all of these settings may be done individually or simultaneously.

Embodiment 2

Figure 6A:
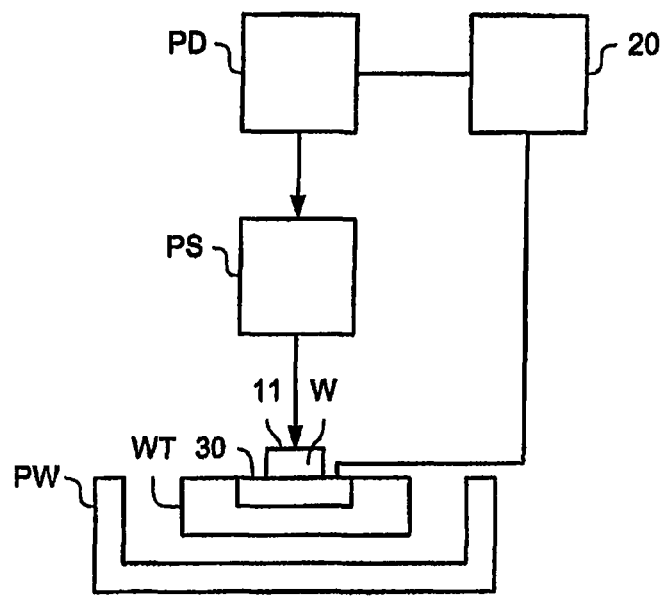
FIGS. 6A and 6B depict a lithographic apparatus of a second embodiment of the invention in a substrate exposing configuration and a radiation beam inspecting configuration, respectively, according to the present invention.
Figure 6B:
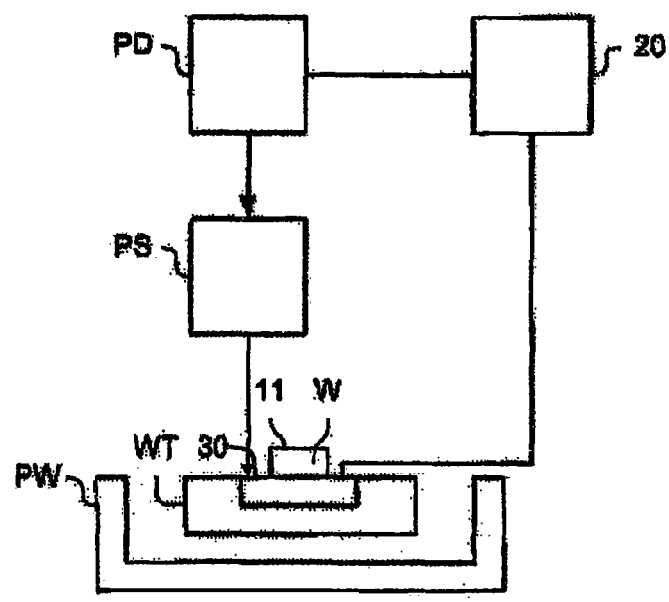

FIGS. 6A and 6B depict a lithographic apparatus of a second embodiment of the present invention in a substrate exposing configuration and a radiation beam inspecting configuration, respectively. Much of the second embodiment is the same as the first embodiment and, for brevity, only the differences will be discussed.

As with the first embodiment, the radiation beam inspection device 30 is mounted to the substrate table WT. However, in the apparatus of the second embodiment, the radiation beam inspection device 30 is mounted beneath the position at which the substrate W may be supported on the substrate table WT. Accordingly, when a substrate W is supported on the substrate table WT, the substrate W is between the projection system PS and the radiation beam inspection device 30. Therefore, as shown in FIG. 6A, the lithographic apparatus is in the substrate exposing configuration when a substrate W is supported on the substrate table WT and, as shown in FIG. 6B, the lithographic apparatus is in the radiation beam inspection configuration when a substrate is supported on the substrate table WT. Accordingly, the required range of movement of the substrate table WT within the plane of the surface 11 of the substrate W on which the pattern is to be exposed (namely the horizontal plane as shown in FIGS. 6A and 6B) is less for the second embodiment than the first embodiment.

In the arrangement shown in FIGS. 6A and 6B, in the radiation beam inspecting configuration, the radiation beam inspection device 30 is not located in the same plane as the surface 11 of the substrate W on which the pattern is to be exposed. In particular, the radiation beam inspection device 30 is further from the projection system PS than the upper surface 11 of the substrate would be by an amount equivalent to the thickness of the substrate W. The control system 20 may, therefore, take this into account when determining from the data provided by the radiation beam inspection device 30, the pattern of radiation that would be exposed on a substrate if the lithographic apparatus was in the substrate exposing configuration. Alternatively or additionally, the actuator PW may be configured to move the substrate table WT vertically such that the radiation beam inspection device 30 does lie within the plane in which the upper surface 11 of the substrate W would lie if a substrate were supported on the substrate table WT. Alternatively or additionally, the substrate table WT may be provided with a further actuator for moving at least the radiation beam inspection device 30 relative to at least a part of the substrate table WT such that the radiation beam inspection device 30 can lie within the plane in which the upper surface 11 of the substrate W would lie if a substrate was supported on the substrate table WT.

Embodiment 3

Figure 7A:
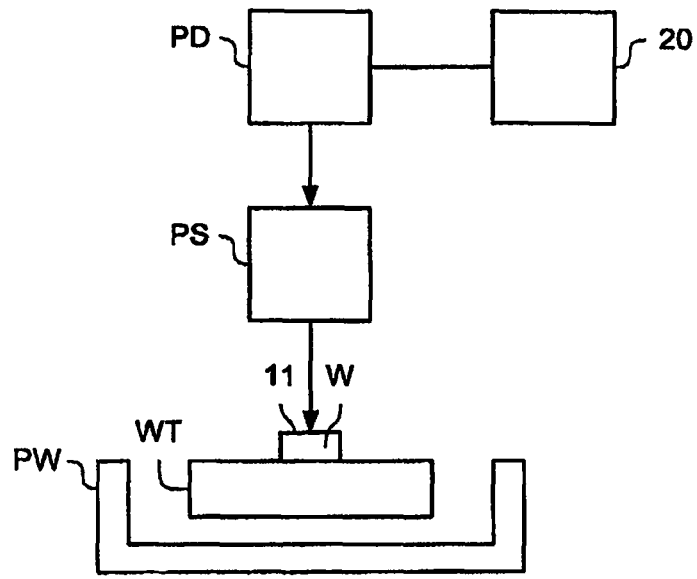
FIGS. 7A and 7B depict a lithographic apparatus of a third embodiment of the invention in a substrate exposing configuration and a radiation beam inspecting configuration, respectively, according to the present invention.
Figure 7B:
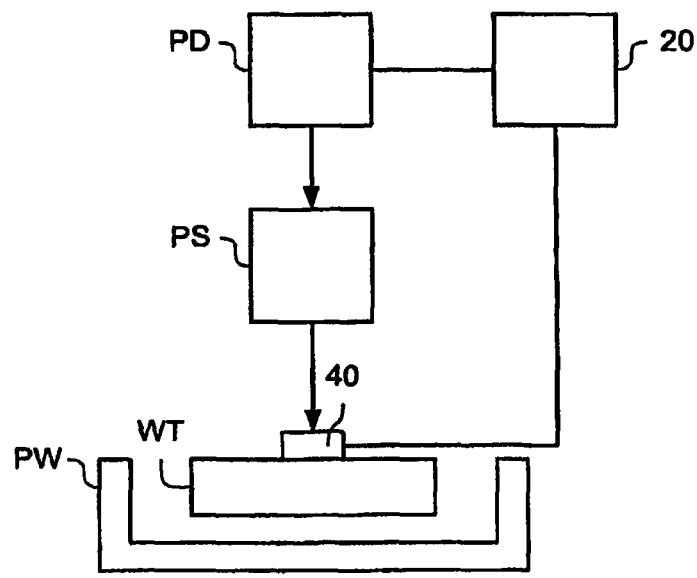

FIGS. 7A and 7B depict a lithographic apparatus, in a substrate exposing configuration and a radiation beam inspecting configuration, respectively, according to a third embodiment of the present invention. Much of the third embodiment corresponds to the first and second embodiments and, for brevity only the differences will be discussed.

In this arrangement, the radiation beam inspection device 40 is detachable from the lithographic apparatus and may be supported on the substrate table WT in place of the substrate W. Therefore, in the substrate exposing configuration, the substrate table WT supports a substrate and, in the radiation beam inspecting configuration, the substrate table WT supports the radiation beam inspection device 40. In one example, the radiation beam inspection device 40 is supported and, held if required, in the same manner as the substrate W. For example, the radiation beam inspection device 40 may be the same size as the substrate. Furthermore, in one example the radiation beam inspection device 40 is the same thickness as a substrate W such that the radiation beam inspection device 40 lies within the same plane that the upper surface 11 of the substrate W would lie in were a substrate supported on the substrate table. Alternatively or additionally, in a corresponding manner to the second embodiment, the actuator PW for positioning the substrate table may be configured to adjust the vertical position of the substrate table in order to adjust the vertical position of the radiation beam inspection device 40. Alternatively or additionally, the substrate table WT may be provided with an additional actuator for adjusting the position of the radiation beam inspection device 40 relative to the remainder of the substrate table WT. Alternatively or additionally, the control system 20 may take account of any differences in the position of the radiation beam inspection device 40 and the upper surface 11 of a substrate W when a substrate is supported on the substrate table.

Embodiment 4

Figure 8A:
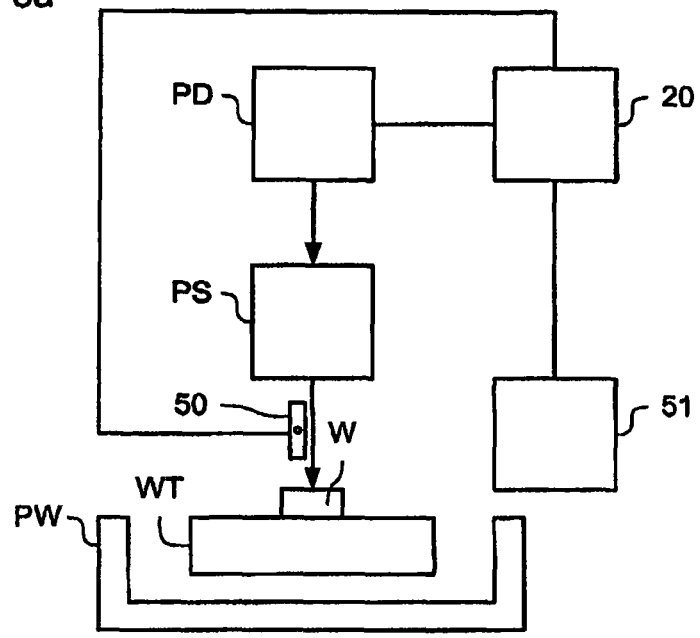
FIGS. 8A and 8B depict a lithographic apparatus of a fourth embodiment of the invention in a substrate exposing configuration and a radiation beam inspecting configuration, respectively, according to the present invention.
Figure 8B:
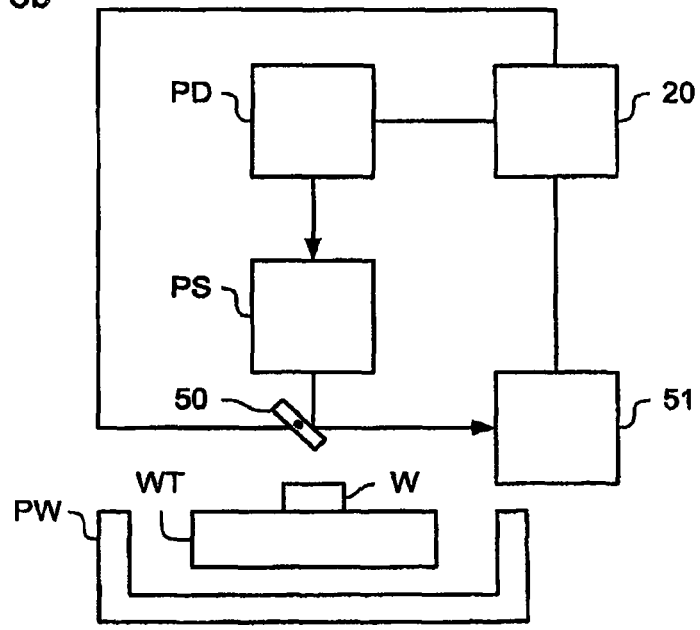

FIGS. 8A and 8B depict a lithographic apparatus of a fourth embodiment of the invention in a substrate exposing configuration and a radiation beam inspecting configuration, respectively. Much of the fourth embodiment corresponds to the first, second, and third embodiments and, for brevity only, the differences will be discussed.

As shown, the apparatus includes an optical element 50 that controls the modulated beam of radiation projected by the projection system PS. The optical element 50 is switchable between a first position, depicted in FIG. 8A, in which the modulated beam of radiation is projected onto the substrate W supported on the substrate table WT and a second position, depicted in FIG. 8B, in which the modulated beam of radiation is directed to the radiation beam inspection device 51. Accordingly, by switching the optical element between the first and second positions, the lithographic apparatus can be switched between a substrate exposing configuration and a radiation beam inspecting configuration.

In the apparatus depicted in FIGS. 8A and 8B the optical element 50 is a planar reflector that can be rotated to either not interfere with the modulated beam of radiation projected by the projection system PS onto the substrate W or to reflect the modulated beam of radiation onto the radiation beam inspection device 51.

It will be appreciated that the apparatus could also be configured such that the modulated beam of radiation is always reflected by a planar reflector but that the modulated beam of radiation is directed to the substrate W when the planar reflector is in a first position and is directed to the radiation beam inspection device 51 when the planar reflector is in a second position. Likewise the optical element may be comprised of a prism that can be rotated instead of a reflector. As a further alternative, the optical element may be formed from an electro-optical material configured such that the direction of the modulated beam of radiation can be controlled by applying a voltage to the electro-optical material. Accordingly, the apparatus may be configured such that, when a first voltage is applied to the electro-optical material, the modulated beam of radiation is directed to the substrate W and, when a second voltage is applied to the electro-optical material, the modulated beam of radiation is directed to the radiation beam inspection device 51.

Embodiment 5

FIG. 9 depicts a control system 20 of the invention according to one embodiment of the present invention. It will be appreciated that the control system of the fifth embodiment of the present invention may be used in combination with the apparatus of any one of the first, second, third, and fourth embodiments of the invention.

As shown, the control system 20 comprises a required pattern data store 61 that stores data corresponding to the required pattern of radiation to be exposed on a substrate. In addition, the control system 20 includes a correction controller 62 which compares the required pattern for a substrate (or a part thereof) with the pattern detected by the radiation beam inspection device 60. The correction controller 62 determines the required correction to the pattern to be set on the patterning device PD and outputs a corrected pattern to the corrected pattern data store 63 which stores pattern data which corresponds to the required pattern to be exposed on the substrate altered as required by the correction control 62. The array controller 64 uses the corrected pattern data from the corrected pattern data store 63 in order to set the pattern to the patterning device PD.

Embodiment 6

FIG. 10 depicts an alternative arrangement of a control system 20, according to another embodiment of the present invention, that may be used with any one of the first, second, third, and fourth embodiments.

As with the above embodiment in FIG. 9, data corresponding to the pattern of radiation required to be exposed on the substrate is stored in a required pattern data store 71. A correction controller 72 compares this data to the data from the radiation beam inspection device 70 in order to determine corrections required to the pattern to be set on the patterning device PD, as described above. The control system 20 further includes a pattern correction data store 73 which stores the modifications to the pattern to be set on the patterning device PD that are determined by the correction controller 72. The array controller 74 sets the pattern on the patterning device PD using the data from the required pattern data store 71 corrected according to the data in the pattern correction data store 73. An advantage of the control system of the sixth embodiment is that a smaller amount of memory is required because only the corrections to the pattern are stored rather than the complete modified pattern.

Embodiment 7

As described above, in any one of the first, second, third, and fourth embodiments, the modification to the operation of the lithographic apparatus may comprise an alteration of one or more of the intensity of the radiation being provided by the illumination system, the conditioning of the radiation beam by the illumination system and one or more settings of the projection system, as an alternative to or in addition to the modification of the pattern set on the patterning device PD.

FIG. 11 depicts the control system 20, according to another embodiment of the present invention. It will be appreciated that in an apparatus in which the pattern set to the patterning device is also adjusted, the control system 20 of this embodiment may be combined with the control system of at least the above two embodiments.

As shown in FIG. 11, the control system 20 includes a required pattern data store 81 and a correction controller 82 which compares the required pattern data with the data from the radiation beam inspection device 80 in order to determine the modifications required to the operation of the lithographic apparatus. Data corresponding to the required changes to the operation of the lithographic apparatus or corresponding to required settings of the lithographic apparatus are stored in a system settings data store 83. The control system 20 further comprises a system controller 84 which controls the settings of at least one of the source SO, the illumination system IL and the projection system PS according to the data in the system settings data store 83.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
   a patterning system configured to provide a patterned radiation beam;
   a projection system configured to project the patterned radiation beam onto a target portion of a substrate;
   a radiation beam inspection device comprising a sensor and a reflecting device and configured to inspect at least a part of the patterned radiation beam;
   a required pattern data store configured to store data corresponding to at least a part of a required pattern corresponding to a pattern feature to be exposed on the substrate; and
   a controller device configured to:
      cause the lithographic apparatus to expose the required pattern onto the target portion of the substrate;
      cause the lithographic apparatus to move between a radiation beam inspection position for inspection of the patterned radiation beam by the radiation beam inspection device and a substrate exposure position; and
      determine a difference between the pattern detected by the radiation beam inspection device with the required pattern and to determine at least one modification to an operation of the lithographic apparatus necessary in order to minimize the difference.

2. The lithographic apparatus of claim 1, wherein the reflecting device comprises a planar reflector configured to be rotatable between a first position and a second position, the first position corresponding to bypassing the patterned radiation beam during the exposure of a pattern of radiation on the substrate and the second position corresponding to interfering with the patterned radiation beam during the radiation beam inspection.

3. The lithographic apparatus of claim 2, wherein the required pattern corresponding to the pattern feature to be exposed on the substrate is a pattern modified according to a characterization of differences resulting from variations in conditions of processing the substrate, between the pattern of radiation exposed on the substrate, and the pattern feature formed on the substrate.

4. The lithographic apparatus of claim 1, wherein:
   the required pattern data store is configured to store data corresponding to a characterization of differences, resulting from variations in conditions of processing the substrate, between the pattern of radiation exposed on the substrate and the pattern feature formed on the substrate; and
   the controller device is configured to determine the pattern required to be exposed on the substrate from the data stored in the required pattern data store.

5. The lithographic apparatus of claim 1, wherein:
   the patterning system comprises an array of individually controllable elements; and
   the at least one modification to the operation of the lithographic apparatus comprises at least one change to the pattern set by the array of individually controllable elements.

6. The lithographic apparatus of claim 5, wherein:
   the pattern feature comprises a plurality of pattern features; and
   the at least one change to the pattern set by the array of the individually controllable elements comprises at least one of an addition of another pattern feature to the plurality of pattern features, a removal of a pattern feature from the plurality of pattern features, and a re-sizing of a pattern feature from the plurality of pattern features.

7. The lithographic apparatus of claim 5, wherein:
   the array of individually controllable elements is constructed such that the intensity of portions of the patterned radiation beam is set to at least three different levels; and
   the at least one change to the pattern set by the array of individually controllable elements comprises adjusting an intensity of the patterned radiation beam in at least one portion of the pattern of radiation.

8. The lithographic apparatus of claim 5, further comprising a corrected pattern data store configured to store pattern data, corresponding to the required pattern to be exposed on the substrate, modified according to the at least one change to the pattern set by the array of individually controllable elements determined by the controller device and the array of individually controllable elements is set according to the pattern data in the corrected pattern data store.

9. The lithographic apparatus of claim 1, wherein:
   in the substrate exposure position, the projection system is configured to expose a pattern of radiation on the substrate using the patterned radiation beam, and the radiation beam inspection device is configured to move the reflecting device away from a light path of the patterned radiation beam; and in the radiation beam inspection position, the radiation beam inspection device is configured to move the reflecting device into the light path of the patterned radiation beam, thereby directing the patterned radiation beam towards the sensor.

10. The lithographic apparatus of claim 1, wherein:
the controller device is configured to modify an operation of the lithographic apparatus according to the at least one modification determined by the controller device while the lithographic apparatus is in the radiation beam inspection position; and
the controller device is configured to determine remaining differences between the pattern detected by the radiation beam inspection device and the required pattern and to determine further modifications to the operation of the lithographic apparatus to minimize the difference.

11. The lithographic apparatus of claim 1, wherein the at least one modification to the operation of the lithographic apparatus comprises an alteration of the conditioning of the radiation beam by an illumination system.

12. The lithographic apparatus of claim 11, further comprising:
a system settings data store configured to store data corresponding to the alteration of the conditioning of the radiation beam by the illumination system; and
a system controller configured to control the lithographic apparatus, in the substrate exposure position, using the data stored in the system settings data store.

13. The lithographic apparatus of claim 1, wherein the reflecting device is located between the projection system and the substrate, the radiation beam inspection device being configured to inspect the at least part of the patterned radiation beam after the patterned radiation beam has passed through the projection system.

14. The lithographic apparatus of claim 1, wherein the at least one modification to the operation of the lithographic apparatus comprises an alteration of an intensity of the radiation beam provided by the patterning system and an alteration of the conditioning of the radiation beam by an illumination system.

15. The lithographic apparatus of claim 1, wherein the at least one modification to the operation of the lithographic apparatus comprises an alteration of an intensity of the radiation beam provided by the patterning system and an alteration of one or more settings of the projection system.

16. The lithographic apparatus of claim 1, wherein the at least one modification to the operation of the lithographic apparatus comprises an alteration of the conditioning of the radiation beam by an illumination system and an alteration of one or more settings of the projection system.

17. The lithographic apparatus of claim 1, wherein the at least one modification to the operation of the lithographic apparatus comprises an alteration of an intensity of the radiation beam provided by the patterning system, an alteration of the conditioning of the radiation beam by an illumination system, and an alteration of one or more settings of the projection system.

18. A method of optimizing operation of a lithographic apparatus for formation of a device on a substrate, the method comprising:
moving a reflecting device into an exposure light path to direct a patterned beam of radiation onto a radiation beam inspection device, wherein the radiation beam inspection device is configured to inspect the pattern of radiation that would be exposed on the substrate that is along the exposure light path;
determining at least one modification to an operation of the lithographic apparatus to minimize a difference between a required pattern corresponding to a pattern feature to be exposed on the substrate and the pattern determined by the radiation beam inspection device; and
projecting a modified patterned radiation beam onto the substrate, after moving the reflecting device out of the exposure light path, with the at least one modification used to produce the modified patterned radiation beam.

19. The method of claim 18, further comprising:
storing data corresponding to at least part of the required pattern to be exposed on the substrate; and
determining the difference between the pattern detected by the radiation beam inspection device and the required pattern.

20. The method of claim 19, wherein the determining the at least one modification comprises modifying an operation of the lithographic apparatus according to the at least one modification determined by a controller device while the lithographic apparatus is in the radiation beam inspection position.

21. The method of claim 20, wherein the modifying the operation of the lithographic apparatus comprises:
determining a remaining difference between the pattern detected by the radiation beam inspection device and the required pattern; and
determining further modification to the operation of the lithographic apparatus to minimize the difference.

22. The method of claim 19, wherein the determining at least one modification to the operation of the lithographic apparatus comprises:
determining at least one of an alteration of an intensity of the radiation beam provided by an illumination system in the lithographic apparatus, an alteration of the conditioning of the radiation beam by the illumination system, and an alteration of one or more settings of the projection system.

23. The method of claim 22, further comprising:
storing data corresponding to the alteration of at least one of the intensity of the radiation beam provided by the illumination system, the conditioning of the radiation beam by the illumination system, and one or more settings of a projection system in the lithographic apparatus; and
controlling the lithographic apparatus, in the substrate exposure position, using the stored data.

24. The method of claim 19, wherein:
the storing data corresponding to at least part of the required pattern comprises storing data corresponding to the pattern feature required to be formed on the substrate; and
the pattern feature is modified according to a characterization of differences from variations in conditions of processing the substrate, between the pattern of radiation exposed on the substrate, and the pattern feature formed on the substrate.

25. The method of claim 19, wherein the storing data corresponding to at least part of the required pattern comprises storing data corresponding to a characterization of differences, resulting from variations in conditions of processing the substrate, between the pattern of radiation exposed on the substrate and the pattern feature formed on the substrate.

26. The method of claim 18, wherein:
the moving comprises moving the reflecting device into the exposure light path in between a projection system and the substrate, and the determining comprises inspecting the patterned beam of radiation after the patterned beam of radiation has passed through the projection system.

\* \* \* \* \*